United States Patent
Thomas et al.

(10) Patent No.: US 12,207,556 B2
(45) Date of Patent: Jan. 21, 2025

(54) METHOD OF DEPOSITION

(71) Applicant: SPTS Technologies Limited, Newport (GB)

(72) Inventors: Adrian Thomas, Newport (GB); Steve Burgess, Newport (GB); Amit Rastogi, Newport (GB); Tony Wilby, Newport (GB); Scott Haymore, Newport (GB)

(73) Assignee: SPTS Technologies Limited, Newport (GB)

( * ) Notice: Subject to any disclaimer, the term of this patent is extended or adjusted under 35 U.S.C. 154(b) by 565 days.

(21) Appl. No.: 16/865,227

(22) Filed: May 1, 2020

(65) Prior Publication Data

US 2020/0365794 A1 Nov. 19, 2020

(30) Foreign Application Priority Data

May 15, 2019 (GB) ..................... 1906840

(51) Int. Cl.
*H03H 3/08* (2006.01)
*C01B 21/06* (2006.01)
(Continued)

(52) U.S. Cl.
CPC ....... *H10N 30/076* (2023.02); *C01B 21/0602* (2013.01); *C23C 14/0036* (2013.01);
(Continued)

(58) Field of Classification Search
None
See application file for complete search history.

(56) References Cited

U.S. PATENT DOCUMENTS 7,524,691 B2  4/2009  Kitaoka et al.
9,940,953 B1*  4/2018  Zavaliche ............... G11B 5/40
(Continued)

FOREIGN PATENT DOCUMENTS

CN  107012422 A  8/2017
CN  107012439 A  8/2017
(Continued)

OTHER PUBLICATIONS

Lu et al. "Surface Morphology and Microstructure of Pulsed DC Magnetron Sputtered Piezoelectric AlN and AlScN Thin Films", Physica status solidi. A: Applications and Materials Science, vol. 215, No. 9, May 1, 2018 (May 1, 2018), p. 1700559, XP055724667, DE ISSN: 1862-6300, DOI 10.1002/pssa.201700559. (Year: 2018).*
(Continued)

*Primary Examiner* — Sarah K Salerno
(74) *Attorney, Agent, or Firm* — Hodgson Russ LLP

(57) ABSTRACT

In a method for sputter depositing an additive-containing aluminium nitride film containing an additive element like Sc or Y, a first layer of the additive-containing aluminium nitride film is deposited onto a substrate disposed within a chamber by pulsed DC reactive sputtering. A second layer of the additive-containing aluminium nitride film is deposited onto the first layer by pulsed DC reactive sputtering. The second layer has the same composition as the first layer. A gas or gaseous mixture is introduced into the chamber when depositing the first layer. A gaseous mixture comprising nitrogen gas and an inert gas is introduced into the chamber when depositing the second layer. The percentage of nitrogen gas in the flow rate (in sccm) when depositing the first layer is greater than that when depositing the second layer.

19 Claims, 4 Drawing Sheets

(51) Int. Cl.
  C23C 14/00      (2006.01)
  C23C 14/02      (2006.01)
  C23C 14/06      (2006.01)
  H03H 3/02       (2006.01)
  H03H 9/02       (2006.01)
  H03H 9/17       (2006.01)
  H10N 30/045     (2023.01)
  H10N 30/076     (2023.01)
  H10N 30/082     (2023.01)
(52) U.S. Cl.
  CPC ........ *C23C 14/021* (2013.01); *C23C 14/0617* (2013.01); *H03H 3/02* (2013.01); *H03H 9/02031* (2013.01); *H03H 9/176* (2013.01); *H10N 30/045* (2023.02); *H10N 30/082* (2023.02); *C01P 2006/40* (2013.01); *C01P 2006/90* (2013.01)

(56) References Cited

U.S. PATENT DOCUMENTS

| 11,482,660 | B1* | 10/2022 | Esteves | H01L 41/0831 |
|---|---|---|---|---|
| 2001/0033900 | A1* | 10/2001 | M'Saad | C03C 23/006 |
| | | | | 427/574 |
| 2008/0296529 | A1 | 12/2008 | Akiyama | |
| 2014/0174908 | A1 | 6/2014 | Feng et al. | |
| 2014/0246305 | A1* | 9/2014 | Larson, III | H03H 9/584 |
| | | | | 204/192.18 |
| 2015/0311046 | A1* | 10/2015 | Yeh | C23C 14/3485 |
| | | | | 204/192.18 |
| 2017/0104465 | A1* | 4/2017 | Burgess | C23C 14/0641 |
| 2018/0041189 | A1* | 2/2018 | Lee | H03H 9/54 |
| 2018/0138888 | A1* | 5/2018 | Yoon | H03H 9/02157 |
| 2018/0159021 | A1* | 6/2018 | Littrell | H10N 30/50 |

FOREIGN PATENT DOCUMENTS

| EP | 0691419 | A1 | 1/1996 | | |
|---|---|---|---|---|---|
| EP | 2871259 | A1 | 5/2015 | | |
| EP | 3153603 | A1 * | 4/2017 | ........ | C23C 14/0036 |
| JP | 2011061063 | A | 3/2011 | | |
| JP | 2013148562 | A | 8/2013 | | |
| JP | 2017095797 | A | 6/2017 | | |

OTHER PUBLICATIONS

Hoglund et al., "Wurtzite structure $Sc_{1-x}Al_xN$ solid solution films grown by reactive magnetron sputter epitaxy: Structural characterization and first-principles calculations," Journal of Applied Physics, 2010, vol. 107, pp. 123515-1-7.

IPO, Search Report for GB Application No. 1906840.2, Oct. 17, 2019.

Lu et al., "Surface Morphology and Microstructure of Pulsed DC Magnetron Sputtered Piezoelectric AlN and AlScN Thin Films," Phys. Status Solidi A, 2018, 215, 1700559, Wiley-VCH Verlag GmbH & Co. KGaA, Weinheim.

TIPO, Office Action for TW Application No. 109114273, Apr. 11, 2023 (see X/Y/A designations at p. 8).

CNIPA, Office Action for CN Application No. 202010378350.7, Jun. 21, 2023 (see X/Y/A designations on pp. 6-7).

JPO, Office Action issued for JP Application No. 2020-078517, Apr. 22, 2024.

* cited by examiner

METHOD OF DEPOSITION

CROSS-REFERENCE TO RELATED APPLICATIONS

This application claims priority to UK Patent Application No. 1906840.2 filed May 15, 2019, the disclosure of which is hereby incorporated by reference.

FIELD OF THE DISCLOSURE

This invention relates to methods for sputter depositing an additive-containing aluminium nitride film. In particular, this invention relates to a pulsed DC reactive sputtering method for depositing an additive-containing aluminium nitride film, such as a scandium- or yttrium-containing aluminium nitride film. The invention relates also to the additive-containing aluminium nitride films themselves and to piezoelectric devices comprising these films.

BACKGROUND OF THE DISCLOSURE

Piezoelectric aluminium nitride (AlN) films have applications in RF resonator devices, such as bulk acoustic wave (BAW) filters. Additive-containing aluminium nitrides have been found to improve the electromechanical coupling efficiency ($K_{eff}$) of the device when compared to non-doped aluminium nitride films. For example, scandium can be incorporated into the alloy at the expense of aluminium to form an additive-containing aluminium nitride of the form $Al_{100-x}Sc_xN$ with a comparatively higher $K_{eff}$. It is understood that when the composition is expressed in the form $Al_{100-x}Sc_xN$, the values 100-x and x are expressed as percentages, and x as a percentage can be equated to 0.01x in stoichiometric chemical terms. In particular, c-axis orientated $Al_{100-x}Sc_xN$ films are preferred for use in resonator devices because this orientation provides enhanced piezoelectric properties of the material.

There is a desire to increase the electromechanical coupling coefficient in order to manufacture higher quality RF resonator devices. For example, increasing the amount of additive element present in an additive-containing aluminium nitride could increase the electromechanical coupling coefficient ($K_{eff}$). However, as the amount of additive element present in additive-containing aluminium nitride increases, there is a greater tendency for crystallographic defects to form. Crystallographic defects reduce the quality and crystallinity of additive-containing aluminium nitride films. These crystal defects are piezoelectrically inactive, and therefore detrimentally affect the electromechanical coupling coefficient of additive-containing aluminium nitride films. That is, the defects have almost no piezoelectric response and can therefore reduce the piezoelectric coupling per unit volume of the film. FIG. 1 shows an SEM image of crystal defects observed on an AlScN film produced using a known deposition method. FIG. 2 shows a higher magnification SEM image of a crystal defect 20. Additionally, these defects can be difficult to etch, can have a detrimental effect on the growth of subsequent layers, and consequently can impact subsequent processing steps.

There is therefore a desire to develop a method for increasing the amount of additive element present in additive-containing aluminium nitride, whilst maintaining an acceptable defect density and crystallinity (or texture). Typically, a defect specification of less than 50 defects per 100 $\mu m^2$ is desirable in order to manufacture high quality devices. Typically, a texture specification of less than 2.0 deg FWHM is desirable in order to manufacture high quality devices.

EP3153603 discloses a method for depositing additive-containing aluminium nitride films by pulsed DC reactive sputtering. However, further methods need to be developed in order to suppress defect levels in additive-containing aluminium nitride films, particularly where the additive concentration is greater than about 8 At %. There is therefore a desire to further increase the additive element concentration (particularly above about 8 At %), whilst suppressing defects and improving the film texture to levels which are acceptable for the commercial manufacture of high quality RF resonator devices. A further proviso for eventual commercialisation would be that the method could be carried out in an economically viable fashion.

BRIEF SUMMARY OF THE DISCLOSURE

The present invention, in at least some of its embodiments, seeks to address at least some of the above described problems, desires and needs. The present invention, in at least some of its embodiments, provides a method for depositing additive-containing aluminium nitride films having a low defect density, high electromechanical coupling coefficient ($K_{eff}$) and which are suitable for use in resonator devices.

According to a first aspect of the invention there is a method for sputter depositing an additive-containing aluminium nitride film containing an additive element selected from Sc or Y, the method comprising the steps of:

depositing a first layer of the additive-containing aluminium nitride film onto a substrate disposed within a chamber by pulsed DC reactive sputtering; and depositing a second layer of the additive-containing aluminium nitride film onto the first layer by pulsed DC reactive sputtering, the second layer having the same composition as the first layer;

wherein:

the step of depositing the first layer comprises introducing a gas or gaseous mixture into the chamber at a flow rate (in sccm), and 87-100% of the flow rate (in sccm) is a flow of nitrogen gas;

the step of depositing the second layer comprises introducing a gaseous mixture into the chamber at a flow rate (in sccm), the gaseous mixture comprising nitrogen gas and an inert gas, and the percentage of nitrogen gas in the flow rate (in sccm) used during the step of depositing the first layer is greater than the percentage of nitrogen gas in the flow rate (in sccm) used during the step of depositing the second layer.

The first layer can be a seed layer. The first layer can provide nucleation sites for directional crystal growth of the second layer, for example with a c-axis orientation. Depositing the first layer in a highly nitrogen rich atmosphere (e.g. 87-100%) has been found to permit high concentrations of an additive element to be incorporated into the aluminium nitride material whilst maintaining acceptable levels of crystal defects, crystallinity and texture.

The additive element can be scandium.

The additive element can be present in an amount in the range 0.5 At % to 40 At %, optionally in the range 8 At % to 40 At %, optionally in the range 10 At % to 35 At %, optionally in the range 15 At % to 30 At %, or optionally in the range 20 At % to 25 At %. The additive element can be present in an amount >8 At %, >10 At %, >15 At %, >20 At %, >25 At %. The additive element can be present in an amount less than or equal to 40 At %. The additive element can be present in any combination of the upper and lower limits provided above. Methods of the present invention can be particularly effective for depositing additive-containing aluminium nitride films having a high concentration of additive element (e.g. above 8 At %), whilst maintaining acceptable levels of defect density, crystallinity and texture.

88% or more, 89% or more, 90% or more, 91% or more, 92% or more, 93% or more, 94% or more, 95% or more, 96% or more, 97% or more, 98% or more, 99% or more, or 100% of the flow rate (in sccm) used during the step of depositing the first layer can be a flow of nitrogen gas. 90-100%, 94-100%, or optionally 98-100% of the flow rate (in sccm) used during the step of depositing the first layer can be a flow of nitrogen gas. The flow rate (in sccm) used during the step of depositing the first layer can comprise or consist of a flow of nitrogen gas and a flow of an inert gas, such as argon.

The flow rate (in sccm) used during the step of depositing the first layer can consist essentially of a flow of nitrogen gas only. Preferably, about 100% of the flow rate (in sccm) during the step of depositing the first layer is a flow of nitrogen gas. That is, the flow rate (in sccm) during the step of depositing the first layer is preferably only a flow of nitrogen gas. The flow rate (in sccm) of nitrogen gas used in the step of depositing the first layer can be 50-500 sccm, optionally 60-250 sccm, optionally 100-200 sccm, or about 150 sccm. The flow rate (in sccm) of nitrogen gas used in the step of depositing the first layer can be greater than 50 sccm, 60 sccm, 100 sccm or 150 sccm. The flow rate (in sccm) of nitrogen gas used in the step of depositing the first layer can be less than 500 sccm, 250 sccm, 200 sccm, or 150 sccm.

By using a nitrogen-rich or nitrogen-only atmosphere during the deposition of the first layer, the defect density, crystallinity and texture of the resultant additive-containing aluminium nitride films can be significantly improved over known methods. These effects are particularly observed in nitrogen-only atmospheres. Without wishing to be bound by any theory or conjecture, it is believed that depositing the first layer only in a nitrogen-rich or nitrogen-only atmosphere has two beneficial effects. Firstly, the number of argon atoms incorporated into the first layer is reduced. This reduces a potential source of atomic defects, which could lead to crystallographic defects propagating through the additive-containing aluminium nitride film. Secondly, it is believed that the sputtering efficiency of the target is reduced because the target material is only being sputtered by nitrogen, rather than also by argon. Therefore, fewer aluminium (or additive element, e.g. Sc or Y) atoms are sputtered from the target. It is believed this increases the proportion of reactive nitrogen species in the deposition chamber so that the reactive nitrogen species can more favourably deposit onto the substrate. This leads to a more nitrogen rich first layer (e.g. initial seed layer) on the substrate that has fewer atomic point defects. Consequently there are fewer nucleation points for crystallographic defects to grow, which suppress defect formation. Additionally, there are a greater number of nucleation sites available for c-axis nitrogen-ended AlScN to grow in a well-orientated textured mode. c-axis $Al_{1-x}Sc_xN$ growth can enhance the piezoelectric properties of the additive-containing aluminium nitride film. Overall, this reduces the number and density of defects in the additive-containing aluminium nitride film, and can improve the electromechanical coupling efficiency of the film. This permits a higher concentration of additive element to be present in the films, whilst maintaining acceptable levels of defect density and texture.

The gas or gaseous mixture used during the step of depositing the first layer can comprise nitrogen gas and an inert gas. The inert gas can be a Noble gas. A Noble gas is understood to be a gas in Group 18 of the Periodic Table of Elements. The inert gas can be xenon, krypton, or preferably argon. As the percentage of inert gas used during the step of depositing the first layer increases to levels used in known prior art, the beneficial effects of the present invention are not observed.

The flow rate of gaseous mixture used in the step of depositing the second layer can comprise about 83% nitrogen gas, and about 17% inert gas, such as argon. The flow rate (in sccm) of nitrogen in the gaseous mixture used in the step of depositing the second layer can be in the range 50-250 sccm; optionally 75-150 sccm; or optionally about 83 sccm. The flow rate (in sccm) of inert gas, such as argon, used in the step of depositing the second layer can be in the range 8-50 sccm; optionally 10-25 sccm; or about 17 sccm. The inert gas does not chemically react with species during the pulsed DC reactive sputtering process. The inert gas can be a sputter gas. The inert gas of the gaseous mixture used during the step of depositing the second layer can be a Noble gas, such as xenon, krypton, or preferably argon. A Noble gas is understood to be a gas in Group 18 of the Periodic Table of Elements.

The proportion of nitrogen gas in the gas or gaseous mixture used during the step of depositing the first layer is typically higher than the proportion of nitrogen gas in the gaseous mixture used in the step of depositing the second layer. Without wishing to be bound by any theory or conjecture, using a gaseous mixture comprising a lower proportion of nitrogen gas for the deposition of the second layer can improve the sputtering efficiency, and hence increase the deposition rate, during the deposition of the second layer.

The chamber can have a pressure of 2-6 mTorr, optionally about 4 mTorr, during the step of depositing the first layer.

The chamber can have a pressure of 1.5-7.5 mTorr, optionally about 3 mTorr, during the step of depositing the second layer.

The first layer can have a thickness of less than 70 nm, optionally less than 60 nm, optionally less than 50 nm, optionally less than 30 nm, optionally less than 25 nm, optionally less than 20 nm, or optionally about 17 nm.

The second layer can have a thickness that is at least 6 times thicker than the first layer, optionally at least 20 times thicker, optionally at least 25 times thicker, optionally at least 50 times thicker, or optionally about 60 times thicker.

The additive-containing aluminium nitride film can have a thickness of 0.3 µm or greater; 0.6 µm or greater; or about 1 µm.

The additive-containing aluminium nitride film can have a thickness of 2 µm or less.

The step of depositing the first layer can be performed with an electrical bias power applied to the substrate. The electrical bias power applied to the substrate during the step of depositing the first layer can be a RF bias power. The electrical bias power applied to the substrate during the step of depositing the first layer can be greater than 200 W, or greater than 250 W. The electrical bias power applied to the substrate during the step of depositing the first layer can be less than 350 W, or less than 300 W. Applying a relatively high bias power to the substrate (e.g. above 200 W) can cause the deposited additive-containing aluminium nitride film to have a compressive stress. The present inventors have found that a first layer (e.g. a seed layer) that has a compressive stress typically results in the additive-containing aluminium nitride film having reduced defect density and improved texture and crystallinity.

The step of depositing the second layer can be performed with no electrical bias power applied to the substrate or with an electrical bias power applied to the substrate that is lower than the electrical bias power applied during the step of depositing the first layer. The electrical bias power applied to the substrate during the step of depositing the second layer can be a RF bias power. The electrical bias power applied during the step of depositing the second layer can be selected so that the overall film stress (i.e. the stress of the first and second layers) is about zero. The electrical bias power applied to the substrate during the step of depositing the second layer can be less than 100 W.

The pulsed DC reactive sputtering can be performed using a magnetron.

Pulsed DC reactive sputtering typically comprises applying pulses of DC power to a sputter target during the sputter deposition. The pulsed DC reactive sputtering can be performed using a single target. The target can be a composite target formed from aluminium and the additive element. The use of multiple targets is possible but is likely to be less economically attractive.

The method can further comprise the step of etching a surface of the substrate prior to the step of depositing the first layer so that the first layer is deposited onto the etched surface of the substrate.

The substrate can be a silicon substrate.

The substrate can comprise a metallic layer, such as a molybdenum layer, onto which the first layer of the additive-containing aluminium nitride film is deposited. The method can further comprise the step of depositing the metallic layer onto the substrate precursor. When a metallic layer, such as a molybdenum layer, is deposited onto the substrate precursor, the first layer is deposited onto the metallic layer. The step of depositing the metallic layer can be performed prior to the step of etching the substrate.

According to a second aspect of the invention there is an additive-containing aluminium nitride film produced by the method according to the first aspect.

According to a third aspect of the invention there is an additive-containing aluminium nitride film containing an additive element selected from Sc or Y in an amount in the range 8 At % to 40 At %, optionally 10 At % to 35 At %, optionally 15 At % to 30 At %, or optionally 20 At % to 25 At %; and having a defect density of less than 50 defects per 100 μm$^2$. The additive element can be present in an amount >8 At %, >10 At %, >15 At %, >20 At %, >25 At %. The additive element can be present in an amount less than or equal to 40 At %. The additive element can be present in any combination of the upper and lower limits provided above.

According to a fourth aspect of the invention there is a piezoelectric device comprising an additive-containing aluminium nitride film according to either of the second or third aspects of the invention.

The piezoelectric device can be a bulk acoustic wave (BAW) device.

The piezoelectric device can comprise a first and a second electrode, with the additive-containing aluminium nitride film being disposed between the first and second electrodes.

Whilst the invention has been described above, it extends to any combination of the features set out above, or in the following description, drawings and claims. For example, any features disclosed in relation to one aspect of the invention may be combined with any features of any of the other aspects of the invention.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
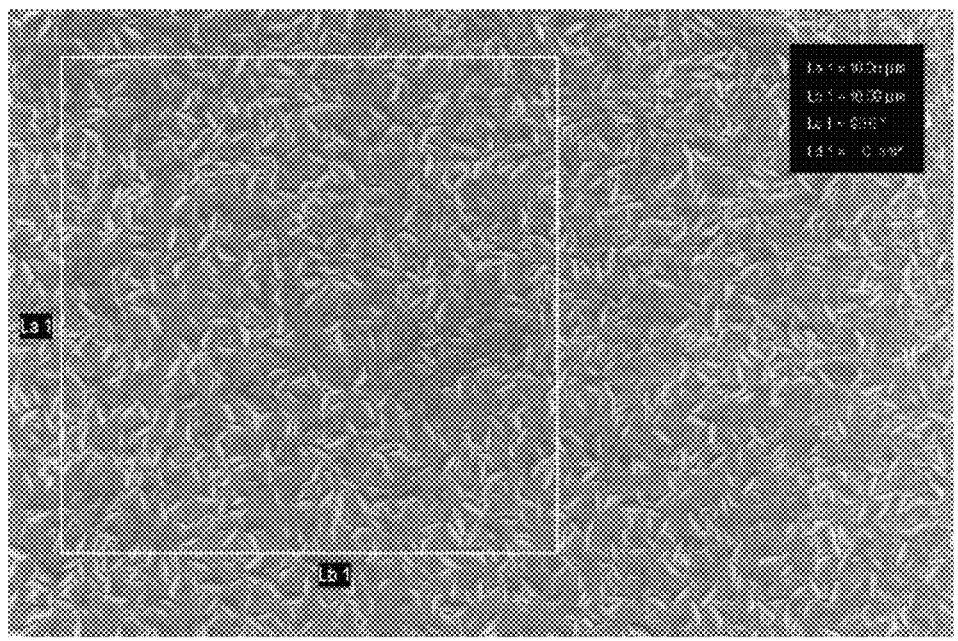
FIG. 1 is an SEM image showing $Al_{80}Sc_{20}N$ defects.
Figure 2:
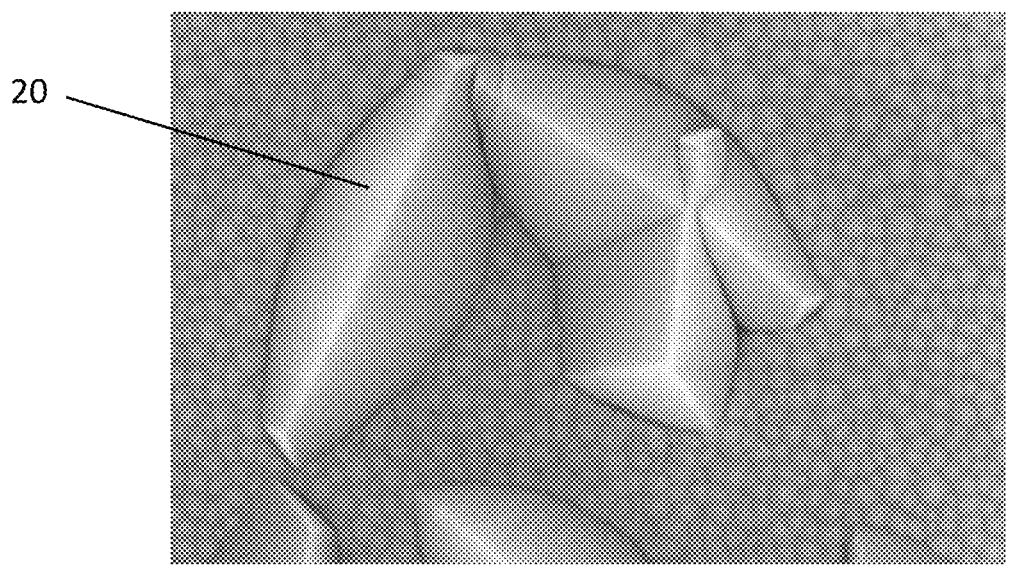
FIG. 2 is an SEM image show an $Al_{80}Sc_{20}N$ defect.

The inventors have discovered an advantageous process for sputter depositing an additive-containing aluminium nitride film. The method can help to improve crystallinity and texture, and reduce crystallite defects in additive-containing aluminium nitride films. The additive-containing aluminium nitride film contains an additive element, such as scandium (Sc) or yttrium (Y). The results presented below are in relation to aluminium scandium nitride ($Al_{1-x}Sc_xN$). However, the method is generally applicable to aluminium yttrium nitride ($Al_{1-x}Y_xN$).

The film is deposited by reactive sputtering such as pulsed DC reactive sputtering. General details concerning apparatus which can be used or readily adapted for use in the present invention are described in the Applicant's European Patent applications EP2871259 and EP3153603, the entire contents of which are hereby incorporated by reference.

The apparatus comprises a substrate disposed in a chamber. The apparatus further comprises a target. The target is a composite target formed from aluminium and the additive element. The composition of the target can determine the amount of additive element contained in the sputter deposited film. The use of multiple targets is possible but is likely to be less economically attractive. Pulsed DC sputtering comprises applying pulses of DC power to the target during the deposition process.

In a first step, a first layer of the additive-containing aluminium nitride film is sputter deposited from the target onto a substrate that is disposed in a chamber. The first layer is deposited by pulsed DC reactive sputtering. The first layer can be a seed layer. During the deposition of the first layer, a gas or gaseous mixture comprising nitrogen, and optionally an inert gas, such as argon, is introduced into the chamber. The flow rate of nitrogen gas (in sccm) during the first step is 87-100% of the total gas flow rate (in sccm) during the first step. Optionally, the flow rate of the nitrogen gas (in sccm) during the first step is 90-100%, 95-100%, 98-100% or about 100% of the total gas flow rate (in sccm) during the first step. Preferably, the gas or gaseous mixture consists only of nitrogen gas. The first layer typically has a thickness of less than about 70 nm, less than 60 nm, less than 50 nm, preferably less than 20 nm. In some embodiments, the first layer has a thickness of about 17 nm.

In a second step, a second layer of the additive-containing aluminium nitride film is subsequently deposited onto the first layer, e.g. onto an initial seed layer. The deposition of the second layer can be a bulk deposition. The second layer is deposited by pulsed DC reactive sputtering. During the deposition of the second layer, a second gaseous mixture comprising nitrogen and an inert gas, such as argon, is introduced into the chamber. Other inert gases, such as xenon and krypton, can be contemplated, although are less preferable due to their higher cost. The proportion of nitrogen gas in the second gas mixture is typically less than the proportion of nitrogen gas in the first gas or gaseous mixture. In one embodiment, the flow rate of the nitrogen gas during the deposition of the second layer is 83 sccm, and the flow rate of argon gas is 17 sccm. That is, the flow rate of nitrogen gas during the second step is about 83% of the total flow rate (in sccm).

Typical deposition parameters for the experiments on a silicon substrate are shown in Table 1.

TABLE 1

Typical process parameters for deposition of AlScN by two-step process.

|  | AlScN first step (seed layer) | AlScN second step (bulk deposition) |
| --- | --- | --- |
| Film thickness | <20 nm | ~980 nm |
| $N_2$ flow (sccm) | 150 | 83-85 |
| Ar flow (sccm) | 0 | 17 |
| Platen RF bias power (Watts) | >250 | 0-100 |
| Chamber pressure (mTorr) | 4 | 3 |

1 μm $Al_{80}Sc_{20}N$ films were sputter deposited onto a silicon substrate using a single target using the methods described above. Table 2 shows how varying the proportion of nitrogen gas during the deposition of the first layer (i.e. initial seed layer) affects the defect density (per 100 μm²) in as deposited 1 μm $Al_{80}Sc_{20}N$ films. Defect density was determined using a scanning electron microscope (SEM) image at a magnification of 6,000 times. Table 3 shows how varying the proportion of nitrogen gas during the deposition of the first layer (i.e. initial seed layer) affects the texture of the as deposited $Al_{80}Sc_{20}N$ film. X-ray diffraction (XRD) full width half maximum (FWHM) measurements were used to determine the texture (or crystallinity) of samples at the centre, mid-radius and the edge of the substrate. A lower FWHM value corresponds to a more crystalline film. Prior to the deposition process, the silicon substrates were subjected to a 2 minute degas step at 350° C. The example listed in the final row of Tables 2 and 3 included the additional step of subjecting the substrate to a 7.5 nm low bias etch step at 350° C. prior to the sputter deposition process. An SE-LTX module, which is commercially available from SPTS Technologies Limited, is suitable for performing for the pre-treatment degassing and etch steps. The 1 μm $Al_{80}Sc_{20}N$ films (shown in Tables 2 and 3) comprise a 17 nm thick compressive first layer (e.g. initial seed layer), and a 983 nm second layer (e.g. bulk layer). The first layer was produced using a 300 W RF bias on the platen. The second layer was produced using a RF bias power that was selected in order to achieve a zero stress across the entirety of the film. That is, a zero stress across both the first and second layers. Typically the bias applied to the platen during the second step is less than the bias applied to the platen during the first step. During the deposition of the second layer, the flow rate of nitrogen gas was 83 sccm, and the flow rate of argon gas was 17 sccm.

TABLE 2

Defect density of 1 μm $Al_{80}Sc_{20}N$ films on Si substrate at different percentage nitrogen flows.

| % $N_2$ flow (sccm) during deposition of first layer | Defect density per 100 sq. μm | | |
| --- | --- | --- | --- |
| | Edge | Mid radius | Centre |
| 78 | 25 | >250 | >500 |
| 83 (Standard) | 10 | 30 | >250 |
| 94 | 5 | 20 | >100 |
| 100 | 1 | 15 | 70 |
| 100 (Degas + etch) | 0 | 0 | 5 |

TABLE 3

XRD FWHM measurements of 1 μm $Al_{80}Sc_{20}N$ films on Si substrate at different percentage nitrogen flows.

| % $N_2$ flow (sccm) during deposition of first layer | Texture (0002) FWHM (Deg) | | |
| --- | --- | --- | --- |
| | Edge | Mid radius | Centre |
| 78 | 1.73 | 1.86 | 1.81 |
| 83 (Standard) | 1.77 | 1.74 | 1.60 |
| 94 | 1.70 | 1.68 | 1.56 |
| 100 | 1.63 | 1.61 | 1.58 |
| 100 (Degas + etch) | 1.64 | 1.60 | 1.54 |

Table 2 shows that as the proportion (i.e. percentage flow) of nitrogen gas increases, the defect density at the edge, mid radius and centre of the substrate decreases. Table 3 shows that as the proportion of nitrogen gas during the first (seed) step increases, the texture (0002) FWHM value tends to decrease at the edge, mid radius and centre of the substrate. These effects are most pronounced when the gas used during the deposition of the first (seed) layer consists only of nitrogen gas.

Figure 3:
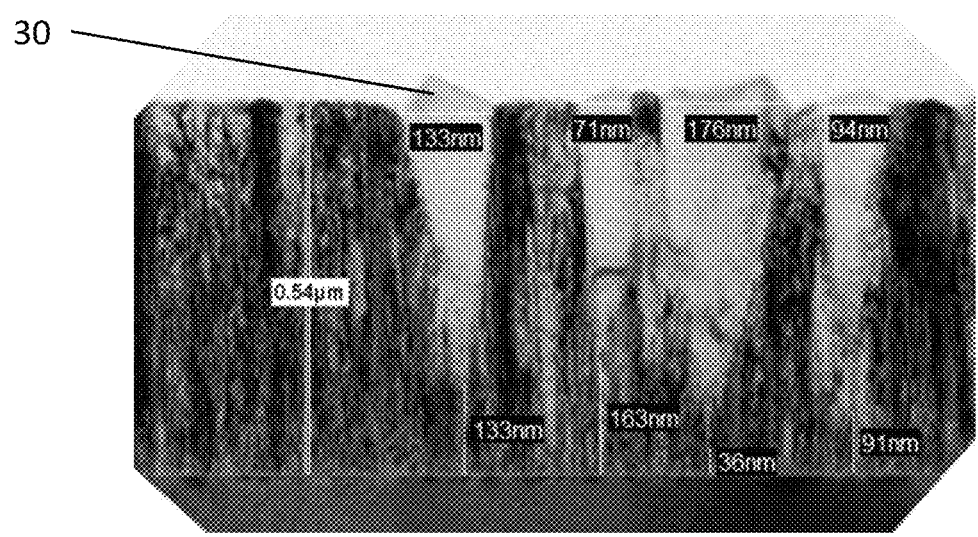
FIG. 3 is a TEM cross-sectional image of $Al_{80}Sc_{20}N$ defects.
Figure 4:
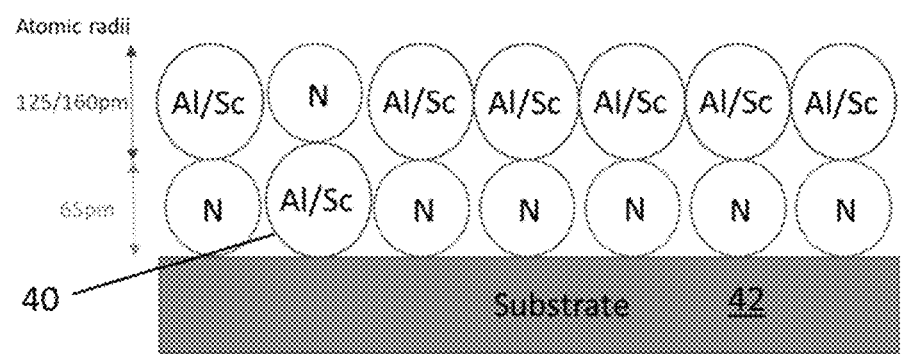
FIG. 4 is an illustration of a first layer in an AlScN film comprising a point defect.
Figure 5:
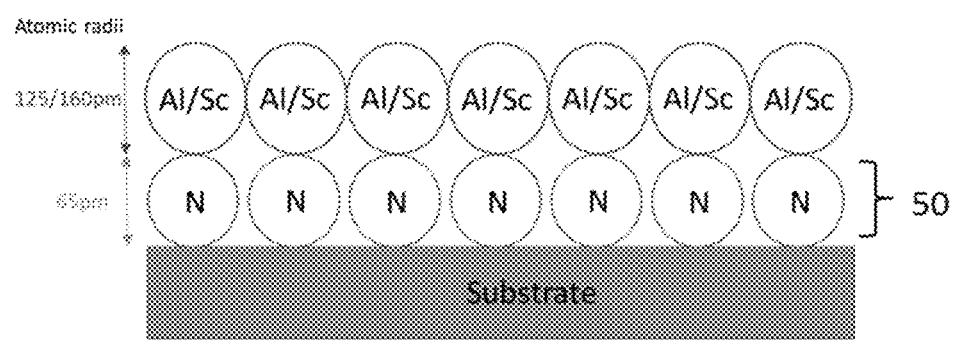
FIG. 5 is an illustration of a first layer in an AlScN film, which is free from point defects.

Without wishing to be bound by any theory or conjecture, it is believed that crystallographic defects are induced by point defects, such as atom misalignment, misplacement or vacancy. The majority of crystal defects in AlScN films are believed to originate from the surface of the substrate material on which the AlScN film is grown. The resulting defect propagates throughout the film and is observable at the film surface. FIG. 3 shows a TEM cross-section of crystal defects 30 in an $Al_{80}Sc_{20}N$ film. The defect 30 propagates through the film. These defects are particularly prominent in additive-containing aluminium nitride films where the additive element (e.g. Sc or Y) is in atomic concentrations of more than about 8 At %. For AlScN films, it is believed that the AlScN grains can be either nitrogen or aluminium (scandium) ended. Without wishing to be bound by any theory or conjecture, it is believed that if a nitrogen layer is deposited as the initial atomic layer, a crystallographic defect will form when an atom of another type is also incorporated into the initial atomic layer of nitrogen. FIG. 4 shows an Al/Sc atom 40 that is incorporated into an initial atomic layer of nitrogen to form a point defect. This defect can propagate throughout the AlScN film. Again without wishing to be bound by any theory or conjecture, it is believed that increasing the proportion of nitrogen gas content during the deposition of the first layer favours the deposition of a seed layer which is substantially free from point defects. For example, the initial atomic layer 50 may substantially consist of nitrogen only (as shown in FIG. 5).

It is preferable to use a nitrogen-rich or nitrogen-only atmosphere during the deposition of the first layer (i.e. initial seed layer). This reduces the number and density of defects in the additive-containing aluminium nitride film, and can improve the electromechanical coupling efficiency of the film. This permits a higher concentration of additive element to be present in the films, whilst maintaining acceptable levels of defect density and texture. Maintaining acceptable levels of defect density and texture in additive-containing aluminium nitride films having a high concentration of additive element (e.g. >8 At %) is not readily achievable using known methods, for example, where the proportion of nitrogen gas in the deposition of the first step is less than about 83-87%.

Figure 6:
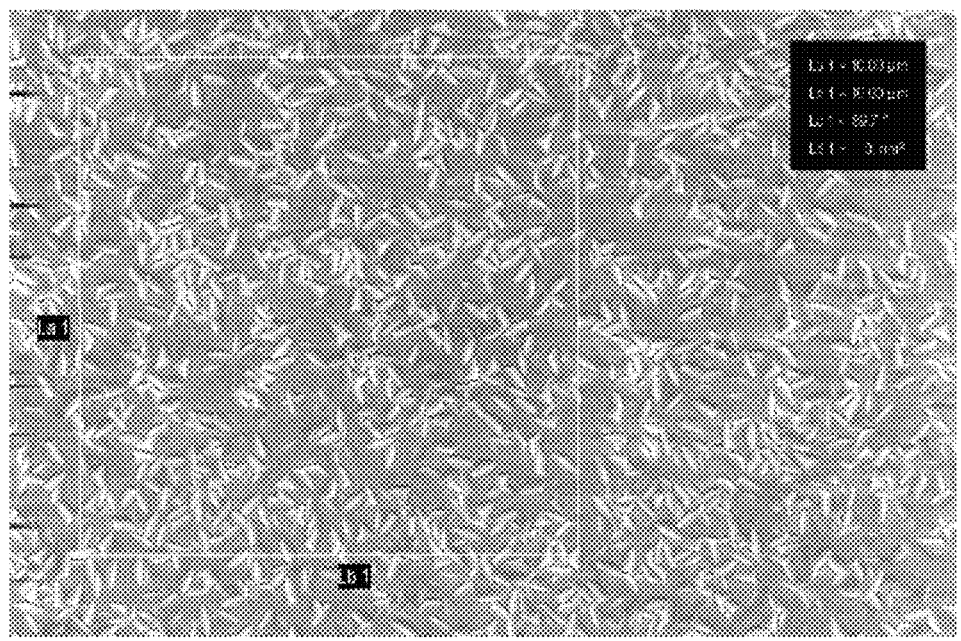
FIG. 6 is an SEM image of an $Al_{80}Sc_{20}N$ film comprising a 17 nm thick first layer having a tensile stress.
Figure 7:
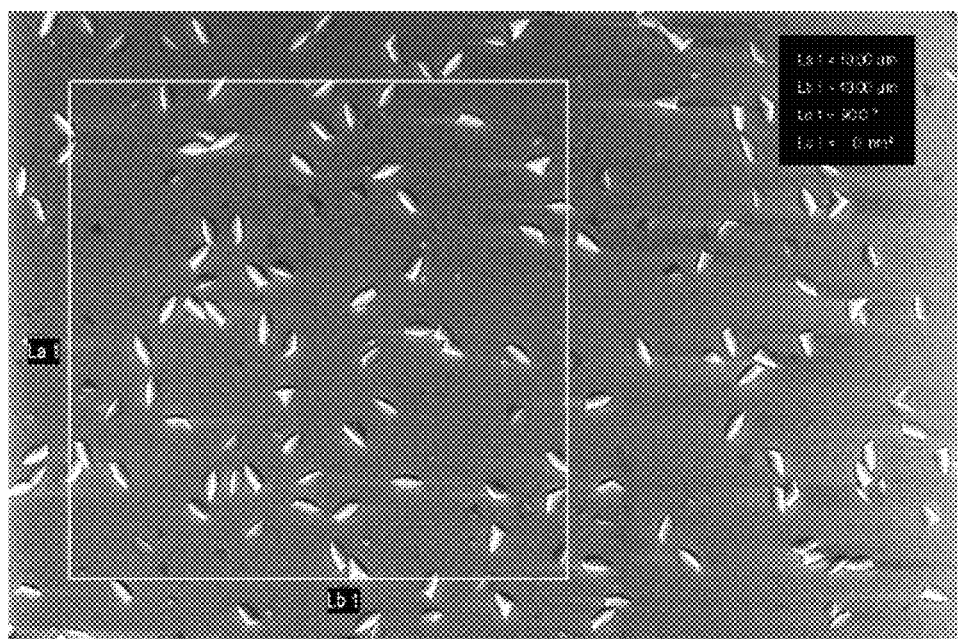
FIG. 7 is an SEM image of an $Al_{80}Sc_{20}N$ film comprising a 17 nm thick first layer having a compressive stress.

The $Al_{80}Sc_{20}N$ films shown in Tables 2 and Tables 3 were prepared by depositing a compressive initial seed layer, followed by a bulk deposition so that the overall stress in the $Al_{80}Sc_{20}N$ film is zero. The stress in the deposited film can be controlled by varying the substrate bias power. Table 4 shows how XRD FWHM measurements of a 1 µm $Al_{80}Sc_{20}N$ film varies if the first layer has a tensile or compressive stress. The 1 µm $Al_{80}Sc_{20}N$ films of Table 4 were formed by introducing only nitrogen gas into the chamber during the deposition of the first layer. The first layer had a thickness of 17 nm, and the second (bulk) layer had a thickness of 983 nm. FIGS. 6 and 7 show SEM images of the $Al_{80}Sc_{20}N$ surface for films deposited with a tensile and compressive first layer respectively. $Al_{80}Sc_{20}N$ films deposited with a compressive first layer exhibit a lower defect density, and an improved texture compared to $Al_{80}Sc_{20}N$ films deposited with a tensile first layer.

TABLE 4

FWHM texture of 1 µm $Al_{80}Sc_{20}N$ films on Si substrate with varying stress in first layer.

| First layer stress | Centre texture FWHM (Deg) | Edge texture FWHM (Deg) |
|---|---|---|
| Tensile | 1.66 | 1.77 |
| Compressive | 1.58 | 1.63 |

The effect of substrate material and surface condition was investigated. 1 µm $Al_{80}Sc_{20}N$ films were deposited onto a molybdenum (Mo) coated substrate using a single composite target. Other metallic materials can be used as the coating material instead of Mo. The Mo-coated substrate was prepared according to the method shown in FIG. 8. A substrate precursor was initially degassed (step 802). A Mo coating was deposited onto the degassed substrate precursor in a Mo deposition module (step 806). The Mo coating was etched using a low bias etch treatment (step 808). The substrate was subsequently transferred to a sputter deposition module for a two-step AlScN deposition process to be performed (steps 810 and 812). The two-step AlScN deposition process comprises i) depositing a first layer (step 810) onto the Mo-coated surface of the substrate in a nitrogen-rich or nitrogen-only atmosphere, followed by ii) depositing a second layer (i.e. bulk deposition) onto the first layer (step 812). The process conditions used in steps 810 and 812 can be the same as or different to those described above in relation to other embodiments of the invention.

Figure 8:
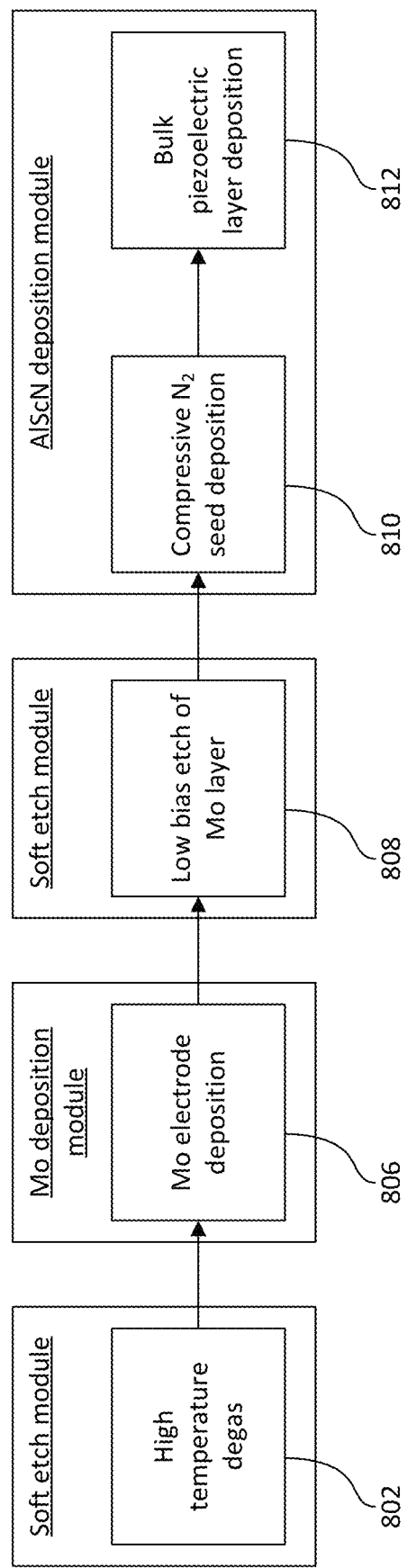
FIG. 8 is a flow chart exemplifying a method of the present invention.

Tables 5 and 6 show how the defect density and texture varies by varying the proportion of nitrogen gas during the deposition of the first layer when depositing a 1 µm $Al_{80}Sc_{20}N$ film onto a molybdenum (Mo) coated substrate using the method of FIG. 8.

TABLE 5

Defect density of 1 µm $Al_{80}Sc_{20}N$ films on Mo substrate at different percentage nitrogen flows.

| % $N_2$ flow (sccm) in seed step | Pre-treatment | Defect density per 100 sq. µm | | |
|---|---|---|---|---|
| | | Edge | Mid radius | Centre |
| 83 (Standard) | Degas and etch | 15 | >50 | >150 |
| 100 | Degas and etch | 2 | 10 | 25 |
| 100 | Degas only, no etch | >100 | >1000 | >1000 |

TABLE 6

FWHM texture of 1 µm $Al_{80}Sc_{20}N$ films on Si substrate at different percentage nitrogen flows.

| % $N_2$ flow (sccm) in seed step | Pre-treatment | Texture (0002) FWHM (Deg) | | |
|---|---|---|---|---|
| | | Edge | Mid radius | Centre |
| 83 (Standard) | Degas and etch | 1.69 | 1.91 | 1.79 |
| 100 | Degas and etch | 1.65 | 1.77 | 1.70 |

Tables 5 and 6 show that the defect density for a 1 µm $Al_{80}Sc_{20}N$ on a Mo-coated substrate can be reduced, and the texture can be improved by using only nitrogen gas in the gaseous atmosphere during the deposition of the first layer. Additionally, conditioning the surface of the substrate by mild etching before depositing AlScN can also help to suppress the formation of crystallographic defects and can improve the texture and crystallinity of the resultant AlScN film.

The effect of the thickness of the first layer on defect density, crystallinity and texture was investigated. 1 µm $Al_{80}Sc_{20}N$ films were prepared on a Mo-coated substrate using only nitrogen gas during the deposition of the first layer. The Mo-substrates were prepared according to the method of FIG. 8. The thickness of the first layer was varied, and the texture of the resultant film was measured using XRD FWHM measurements. The results are shown in Table 7. The thinner first layer resulted in a more textured (i.e. improved texture) $Al_{80}Sc_{20}N$ film. This effect is more significant at the edge of the substrate. A suitable thickness of the first layer is typically less than 70 nm, less than 60 nm, less than 50 nm, less than 30 nm, less than 25 nm, or less than 20 nm.

TABLE 7

Influence of first layer thickness on $Al_{80}Sc_{20}N$ texture.

| $N_2$ Seed Thickness (nm) | Texture (0002) FWHM (Deg) | | |
|---|---|---|---|
| | Edge | Mid radius | Centre |
| 17 | 1.70 | 1.71 | 1.65 |
| 50 | 1.83 | 1.79 | 1.66 |

In particular, the combination of depositing a thin first layer in a nitrogen-rich or nitrogen-only atmosphere has been found to significantly reduce defect density, and improve crystallinity and texture. These beneficial effects are observed even at high concentrations of additive element concentrations. Therefore, methods of the present invention are particularly suited for depositing additive-containing aluminium nitride films having high concentrations of the additive element whilst maintaining acceptable levels of defect density, crystallinity and texture.

The methods described above can be used to deposit additive-containing aluminium nitride films, such as $Al_{1-x}Sc_xN$, with varying concentrations of additive element. 1 μm $Al_{1-x}Sc_xN$ films were deposited with 0 At %, 9 At %, 15 At % and 20 At % on a bare silicon substrate. The additive-containing aluminium nitride films were deposited from a single, composite target. The amount of additive material in the deposited film was determined by the composition of the target. The first layer was deposited with an RF bias power of 200-350 W applied to the substrate. Only nitrogen gas was introduced into the chamber during the deposition of the first layer. That is, the flow rate during the step of depositing the first layer consisted of a flow of nitrogen gas. The thickness of the first layer was about 20 nm. The texture at the edge and centre of the as deposited film was measured, and the results are shown in Table 8.

TABLE 8

FWHM texture of 1 μm $Al_{1-x}Sc_xN$ films on Si substrate with varying seed compositions

| Composition of X in $Al_{1-x}Sc_xN$ | % $N_2$ flow (sccm) in first step | Texture (0002) FWHM (Deg) | |
|---|---|---|---|
| | | Edge | Centre |
| 0.15 | 83 | 1.88 | 1.95 |
| | 100 | 1.76 | 1.78 |
| 0.09 | 83 | 1.66 | 1.69 |
| | 100 | 1.61 | 1.62 |
| 0 | 83 | 1.56 | 1.55 |
| | 100 | 1.50 | 1.50 |

The present inventors found that depositing a first layer (e.g. an initial seed layer) of about 20 nm, wherein 100% of the flow rate (in sccm) is a flow of nitrogen gas ($N_2$), improved the texture of the as deposited films at a range of additive element concentrations. Improvements were observed for all additive element concentrations. This is particularly advantageous for higher additive element concentrations, where known prior methods result in unacceptable levels of defects and poor texture. The present method permits acceptable levels of texture and defect density to be achieved for additive element concentrations above 8 At %, 9 At %, 10 At %, 15 At %, 20 At %, and 25 At %.

What is claimed is:

1. A method for sputter depositing an additive-containing aluminium nitride film containing an additive element selected from Sc or Y, the method comprising the steps of:
   depositing a first layer of the additive-containing aluminium nitride film onto a substrate disposed within a chamber by pulsed DC reactive sputtering, wherein the step of depositing the first layer is performed with an RF bias power above 250 W applied to the substrate, and wherein the first layer is compressive; and
   depositing a second layer of the additive-containing aluminium nitride film onto the first layer by pulsed DC reactive sputtering, the second layer having the same composition as the first layer, wherein the step of depositing the second layer is performed with an RF bias power lower than the RF bias power applied during the step of depositing the first layer, and wherein the RF bias power for the step of depositing the second layer is selected so that an overall film stress of the first layer and the second layer is approximately zero;
   wherein:
   the step of depositing the first layer comprises introducing a gas or gaseous mixture into the chamber at a flow rate (in sccm), and 87-100% of the flow rate (in sccm) is a flow of nitrogen gas;
   the step of depositing the second layer comprises introducing a gaseous mixture into the chamber at a flow rate (in sccm), the gaseous mixture comprising nitrogen gas and an inert gas;
   the percentage of the nitrogen gas in the flow rate (in sccm) used during the step of depositing the first layer is greater than a percentage of the nitrogen gas in the flow rate (in sccm) used during the step of depositing the second layer whereby the additive-containing aluminium nitride film has a defect density of less than 50 defects per 100 um$^2$; and
   the substrate comprises a metallic layer onto which the first layer of the additive-containing aluminium nitride film is deposited.

2. A method according to claim 1, wherein the additive element is scandium.

3. A method according to claim 1, wherein the additive element is present in an amount in the range 0.5 At % to 40 At %.

4. The method according to claim 1, wherein 90-100% of the flow rate (in sccm) used during the step of depositing the first layer is a flow of nitrogen gas.

5. The method according to claim 4, wherein the flow rate (in sccm) used during the step of depositing the first layer consists essentially of a flow of nitrogen gas only.

6. The method according to claim 1, wherein the flow of nitrogen gas used during the step of depositing the first layer is in the range 50 to 500 sccm.

7. The method according to claim 1, wherein the gas or gaseous mixture used during the step of depositing the first layer comprises nitrogen gas and an inert gas.

8. The method according to claim 1, wherein the chamber has a pressure in the range 2-6 mTorr during the step of depositing the first layer.

9. The method according to claim 1, wherein the chamber has a pressure in the range 1.5-7.5 mTorr during the step of depositing the second layer.

10. The method according to claim 1, wherein the first layer has a thickness of less than 70 nm.

11. The method according to claim 1, wherein the additive-containing aluminium nitride film has a thickness of 0.3 μm or greater; 0.6 μm or greater; or about 1 μm.

12. The method according to claim 1, wherein the additive-containing aluminium nitride film has a thickness of 2 μm or less.

13. The method according to claim 1, wherein the step of depositing the second layer is performed with no electrical bias power applied to the substrate.

14. The method according to claim 1 further comprising the step of etching a surface of the substrate prior to the step of depositing the first layer so that the first layer is deposited onto the etched surface of the substrate.

15. The method according to claim 1 wherein the substrate is a silicon substrate.

16. The method according to claim 1 wherein the metallic layer is a molybdenum layer.

17. The method according to claim 16 further comprising the step of depositing the metallic layer onto a substrate precursor.

18. An additive-containing aluminium nitride film produced by the method according to claim 1.

19. The method according to claim 1, wherein only one target is used during the pulsed DC reactive sputtering.

* * * * *